United States Patent
Jeon

(10) Patent No.: US 11,588,127 B2
(45) Date of Patent: Feb. 21, 2023

(54) ORGANIC LIGHT EMITTING DIODE DISPLAY

(71) Applicant: Samsung Display Co., Ltd., Yongin-si (KR)

(72) Inventor: Hee Chul Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/373,256

(22) Filed: Jul. 12, 2021

(65) Prior Publication Data

US 2021/0343967 A1 Nov. 4, 2021

Related U.S. Application Data

(63) Continuation of application No. 16/577,475, filed on Sep. 20, 2019, now Pat. No. 11,063,233, which is a
(Continued)

(30) Foreign Application Priority Data

Oct. 16, 2013 (KR) .................. 10-2013-0123512

(51) Int. Cl.
*H01L 51/50* (2006.01)
*H01L 51/52* (2006.01)
(Continued)

(52) U.S. Cl.
CPC ........ *H01L 51/5044* (2013.01); *H01L 27/288* (2013.01); *H01L 51/5072* (2013.01);
(Continued)

(58) Field of Classification Search
IPC .......... H01L 51/5044,27/288, 51/5072, 51/525, 27/3218, 27/3246, 27/3251, 51/102
See application file for complete search history.

(56) References Cited

U.S. PATENT DOCUMENTS

| 8,049,409 B2 | 11/2011 | Su |
| 8,350,468 B2 | 1/2013 | Ko et al. |

(Continued)

FOREIGN PATENT DOCUMENTS

| JP | 2011233512 | 11/2017 |
| KR | 10-833775 | 5/2008 |

(Continued)

OTHER PUBLICATIONS

Notice of Allowance dated Jun. 30, 2020, in U.S. Appl. No. 16/577,475.
(Continued)

*Primary Examiner* — Hrayr A Sayadian
(74) *Attorney, Agent, or Firm* — H.C. Park & Associates, PLC

(57) ABSTRACT

An organic light emitting diode display is provided that may include a first substrate, a plurality of electrodes on the first substrate and spaced apart from each other, a pixel defining layer on the plurality of electrodes, spacers on the pixel defining layer, and a second substrate on the spacers. The pixel defining layer includes a plurality of openings spaced apart from each other and respectively open to the plurality of electrodes. The spacers on the pixel defining layer are at crossing points of a plurality of virtual lines, the spacers crossing spaces between adjacent openings of the plurality of openings.

40 Claims, 3 Drawing Sheets

Related U.S. Application Data continuation of application No. 15/669,653, filed on Aug. 4, 2017, now Pat. No. 10,431,764, which is a continuation of application No. 14/476,809, filed on Sep. 4, 2014, now Pat. No. 9,728,744.

(51) Int. Cl.
*H01L 27/28* (2006.01)
*H01L 27/32* (2006.01)
*H01L 51/10* (2006.01)

(52) U.S. Cl.
CPC ........ *H01L 51/525* (2013.01); *H01L 27/3218* (2013.01); *H01L 27/3246* (2013.01); *H01L 27/3251* (2013.01); *H01L 51/102* (2013.01)

(56) References Cited

U.S. PATENT DOCUMENTS

| | | | |
|---|---|---|---|
| 8,736,158 | B1 | 5/2014 | Oh et al. |
| 2010/0171416 | A1 | 7/2010 | Lee |
| 2010/0315318 | A1 | 12/2010 | Lee et al. |
| 2011/0221334 | A1* | 9/2011 | Kwon .................. H01L 27/3246 313/504 |
| 2013/0113363 | A1 | 5/2013 | Hong |
| 2015/0102319 | A1 | 4/2015 | Jeon |
| 2015/0207094 | A1 | 7/2015 | Hwang |
| 2020/0319549 | A1 | 10/2020 | Tanigaki et al. |

FOREIGN PATENT DOCUMENTS

| | | |
|---|---|---|
| KR | 10-2009-0049515 | 5/2009 |
| KR | 10-2009-0132359 | 12/2009 |
| KR | 10-2010-0003243 | 1/2010 |
| KR | 10-2010-0132155 | 12/2010 |
| KR | 10-1084248 | 11/2011 |

OTHER PUBLICATIONS

Notice of Allowance dated Oct. 19, 2020, in U.S. Appl. No. 16/577,475.
Notice of Allowance dated Mar. 9, 2021, in U.S. Appl. No. 16/577,475.
Notice of Allowance dated Aug. 7, 2019, in U.S. Appl. No. 15/669,653.
Notice of Allowance dated May 22, 2019, in U.S. Appl. No. 15/669,653.
Non-Final Office Action dated Nov. 5, 2018, in U.S. Appl. No. 15/669,653.
Notice of Allowance dated Mar. 29, 2017, in U.S. Appl. No. 14/476,809.
Final Office Action dated Nov. 18, 2016, in U.S. Appl. No. 14/476,809.
Non-Final Office Action dated Apr. 25, 2016, in U.S. Appl. No. 14/476,809.

* cited by examiner

ORGANIC LIGHT EMITTING DIODE DISPLAY

CROSS-REFERENCE TO RELATED APPLICATION

This application is a Continuation of U.S. patent application Ser. No. 16/577,475, filed Sep. 20, 2019, which issued as U.S. Pat. No. 11,063,233, which is a Continuation of U.S. patent application Ser. No. 15/669,653, filed Aug. 4, 2017, which issued as U.S. Pat. No. 10,431,764, which is a Continuation of U.S. patent application Ser. No. 14/476,809, filed Sep. 4, 2014, which issued as U.S. Pat. No. 9,728,744, which claims priority from Korean Patent Application No. 10-2013-0123512, filed on Oct. 16, 2013, each of which is hereby incorporated by reference for all purposes as if fully set for the herein.

BACKGROUND

1. Field

Embodiments relate to an organic light emitting diode (OLED) display and to an OLED display including a pixel defining layer.

2. Description of the Related Art

A display device is a device displaying an image. An OLED display has recently received attention. The OLED display may have self-luminous characteristics and does not generally require a separate light source, unlike a liquid crystal display device, and thus can have reduced thickness and weight. Further, the OLED display may have high-quality characteristics, such as low power consumption, high luminance, and a high reaction speed.

SUMMARY

Embodiments are directed to an organic light emitting diode display that include a first substrate, a plurality of electrodes on the first substrate and spaced apart from each other, a pixel defining layer on the plurality of electrodes, spacers on the pixel defining layer, and a second substrate on the spacers. The pixel defining layer includes a plurality of openings spaced apart from each other and respectively open to the plurality of electrodes. The spacers on the pixel defining layer are at crossing points of a plurality of virtual lines, the spacers crossing spaces between adjacent openings of the plurality of openings.

Each spacer may include a main body having a center point coincident to a respective crossing point, and protrusions protruding from the main body toward the spaces between adjacent openings. Each protrusion may have an area that may be about 3% to about 6% of an entire area of any one of the adjacent openings. Each protrusion may have an area that may be about 4.5% of an entire area of any one of the adjacent openings. The main body may have a quadrangular shape, and each protrusion may have a triangular shape. The OLED display may further include a first common layer on the electrodes and the spacers, organic light emission layers on the first common layer corresponding to the plurality of openings, and a second common layer on the first common layer, and on the light emission layers and the spacers.

An OLED display includes a first substrate, a plurality of first electrodes on the first substrate, a plurality of second electrodes, a plurality of third electrodes, a pixel defining layer, spacers, and a second substrate on the spacers. The plurality of first electrodes is spaced apart from each other in a first direction extending along a surface of the first substrate. Each of the plurality of second electrodes is between adjacent ones of the plurality of first electrodes in the first direction. The plurality of third electrodes is spaced apart from each other in a second direction parallel to the first direction, and corresponds to the adjacent first electrodes and second electrodes, respectively. The pixel defining layer is on the first electrodes, the second electrodes, and the third electrodes. The pixel defining layer includes first openings open to a part of the first electrodes, second openings spaced apart from the first openings and open to a part of the second electrodes, and third openings spaced apart from the second openings and open to a part of the third electrodes. The spacers are on the pixel defining layer at crossing points of first virtual lines. The spacers cross first spaces between the first openings and the second openings. The second virtual lines cross second spaces between the first openings and the third openings.

Each spacer may include a main body at a respective crossing point, a first protrusion protruding from the main body toward a respective first space between a respective one of the first openings and a respective one of the second openings, a second protrusion protruding from the main body toward a respective second space between the respective one of the first openings and a respective one of the third openings, and a third protrusion protruding from the main body toward a third space between the the respective one of the second openings and the respective one of the third openings. Each spacer may have a quadrangular shape. Each of the respective first openings, the respective second openings, and the respective third openings may have a rectangular shape. One or more of the first protrusion, the second protrusion, and the third protrusion may have an area that may be 3% to 6% of an entire area of any one of the respective first openings and the respective second openings. One or more of the first protrusion, the second protrusion, and the third protrusion may have an area that may be about 4.5% of an entire area of any one of the respective first openings and the respective second openings. Each spacer may be spaced apart from the respective third openings by about 7 µm to about 14 µm. Each spacer may be spaced apart from the respective third openings by about 13 µm. The OLED display may have a quadrangular shape, and each of the first protrusion, the second protrusion, and the third protrusion may have a triangular shape. A first corner of the main body may be adjacent to a first corner of the respective one of the first openings, and a second corner of the main body may be adjacent to a first corner of the respective one of the second openings.

The OLED display may further include: a first common layer on the first electrodes, the second electrodes, the third electrodes, and the spacers; a first organic light emission layer on the first common layer corresponding to the first openings; a second organic light emission layer on the first common layer corresponding to the second openings; a third organic light emission layer on the first common layer corresponding to the third openings; and a second common layer on the first common layer, and on the first organic light emission layer, the second organic light emission layer, the third organic light emission layer, and the spacer. Each of the first organic light emission layer, the second organic light emission layer, and the third organic light emission layer may emit light of a different color. The third organic light emission layer may emit blue light, and any one of the first organic light emission layer and the second organic light emission layer may emit red light, and the other one may emit green light. The pixel defining layer and the spacer may be integral.

BRIEF DESCRIPTION OF THE DRAWINGS

Features will become apparent to those of skill in the art by describing in detail embodiments with reference to the attached drawings in which.

DETAILED DESCRIPTION

Figure 1:
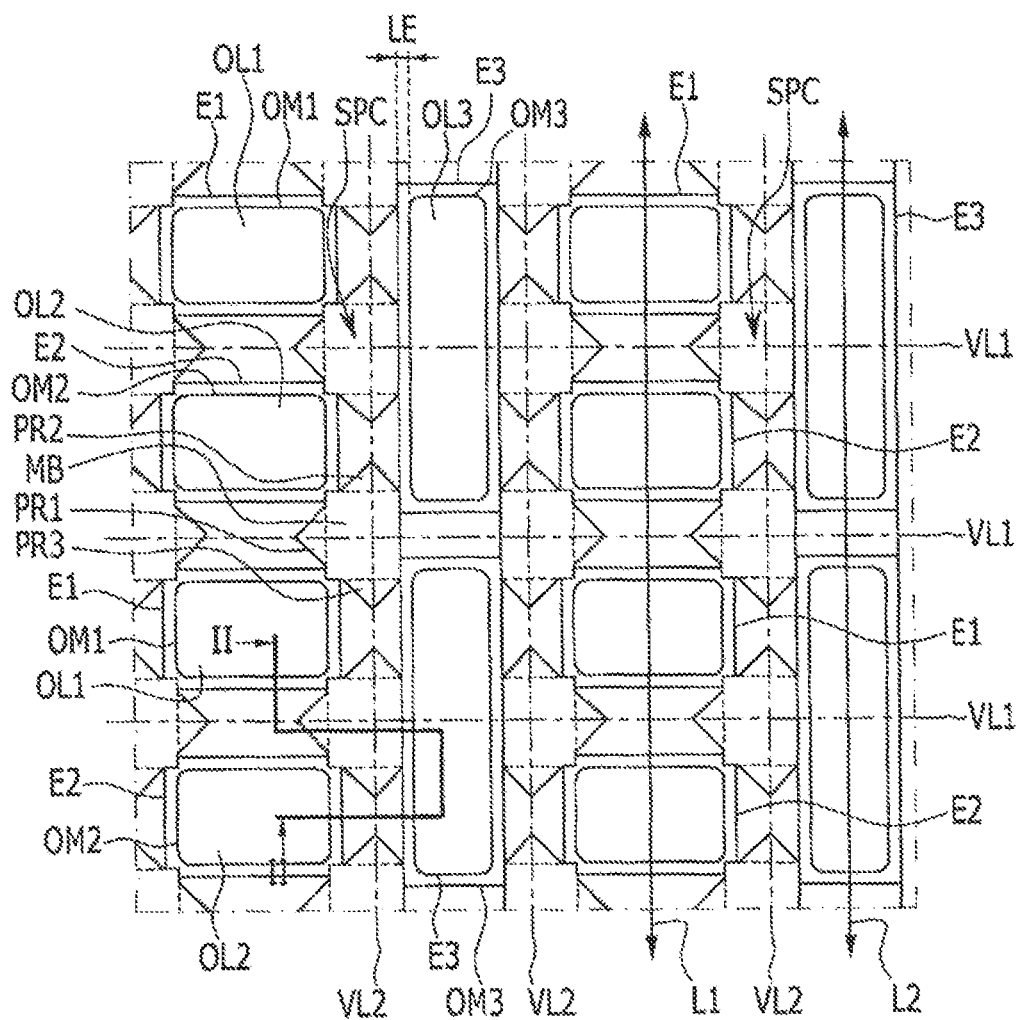
FIG. 1 illustrates a top plan view of a part of an OLED display according to a first embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. In addition, the size and thickness of each component shown in the drawings are arbitrarily shown for understanding and ease of description, in a non-limiting manner. Like reference numerals refer to like elements throughout. In addition, unless explicitly described to the contrary, the word "comprise" and variations such as "comprises" or "comprising," will be understood to imply the inclusion of stated elements but not the exclusion of any other elements.

Figure 2:
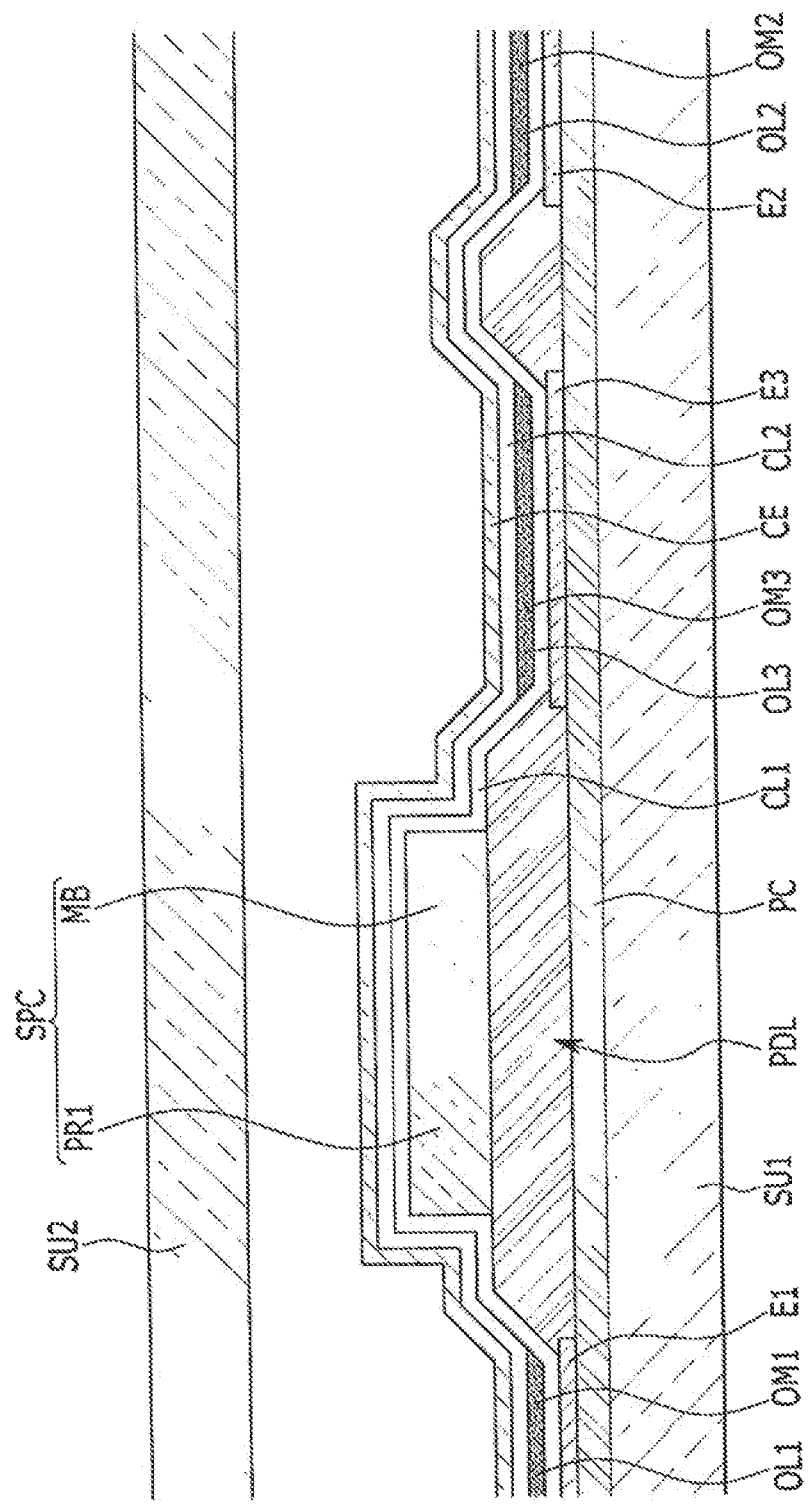
FIG. 2 illustrates a cross-sectional view taken along line II-II of FIG. 1.

An OLED display is described with reference to FIGS. 1 and 2. FIG. 1 illustrates a top plan view of a part of an OLED display. FIG. 1 mainly illustrates a first electrode, a pixel defining layer, an organic light emission layer, and a spacer. FIG. 2 illustrates a cross-sectional view taken along line II-II of FIG. 1. As illustrated in FIGS. 1 and 2, an OLED display 1000 may include a first substrate SU1, a circuit unit PC, first electrodes E1, second electrodes E2, third electrodes E3, a pixel defining layer PDL, spacers SPC, a first common layer CL1, a first organic light emission layer OL1, a second organic light emission layer OL2, a third organic light emission layer OL3, a second common layer CL2, a common electrode CE, and a second substrate SU2.

The first substrate SU1 may include an insulating substrate made of glass, quartz, ceramic, metal, plastics, and the like. Further, for example, where the first substrate SU1 is made of plastics and the like, the OLED display may have a flexible characteristic, and a stretchable or rollable characteristic.

The circuit unit PC may be on the first substrate SU1, and may include wires including one or more scan lines, data lines, driving power lines, common power lines and the like, pixel circuits, such as two or more thin film transistors (TFT) and one or more capacitors, and the like connected to the wires to correspond to one pixel. The circuit unit PC may include various suitable structures. The term "pixel" refers to a minimum unit of displaying an image.

The first electrodes E1 may be on the first substrate SU1. The number of first electrodes E1 may be plural. The respective first electrodes E1 may be spaced apart from each other in a first direction L1 extended along a surface of the first substrate SU1. The second electrodes E2 may be on the first substrate SU1, and the number of second electrodes E2 may be plural. Each of the plurality of second electrodes E2 may be between adjacent first electrodes E1 in the first direction L1. The third electrodes E3 may be on the first substrate SU1, and the number of third electrodes E3 may be plural. The respective third electrodes E3 may be to be spaced apart from each other in a second direction L2 parallel to the first direction L1. First and second directions L1, L2, may each be considered as an array extending in two directions, for example, forwards and backwards along a common axis. The third electrodes E3 may correspond to the first electrodes E1 and the second electrodes E2. The third electrode E3 may have a larger area than the first electrode E1 and the second electrode E2. Each of the first electrode E1, the second electrode E2, and the third electrode E3 may be an anode electrode serving as a hole injection electrode or may be a cathode electrode. The first electrode E1, the second electrode E2, and the third electrode E3 may each independently be a light transmissive electrode, a light transflective electrode, or a light reflective electrode. One or more types of electrode may overlap, in part, with one or more other types of electrode. Any electrode may partially overlap with one or more other electrodes. For example, two or more of the first electrode E1, the second electrode E2, and the third electrode E3 may overlap partially with one another.

The pixel defining layer PDL may be on the first electrode E1, the second electrode E2, and the third electrode E3, and may cover a border of each of the first electrode E1, the second electrode E2, and the third electrode E3. The pixel defining layer PDL may include first openings OM1, second openings OM2, and third openings OM3 through which a part of each of the first electrodes E1, the second electrodes E2, and the third electrodes E3 are opened. The first opening OM1 may be open to a part of the first electrode E1, and may have a substantially rectangular shape. The first opening OM1 may be spaced apart from the third opening OM3 and the second opening OM2, and may have a smaller area than the third opening OM3. The first opening OM1 may have a polygonal shape, for example, such as a triangle, quadrangular shape, a rectangle, a pentagon, a hexagon, a heptagon, and an octagon. The number of first openings OM1 may be plural, and each of the plurality of first openings OM1 may open to a part of one of the plurality of first electrodes E1. The first organic light emission layer OL1 emitting red light may be on the first electrode E1 open to the first opening OM1. Organic light emission layers emitting light of various colors, such as blue, green, and white, may be on the first electrode E1 open to the first opening OM1.

The second opening OM2 may open to a part of the second electrode E2, and may have a substantially rectangular shape. The second opening OM2 may be spaced apart from the third opening OM3 and the first opening OM1, and may have a smaller area than the third opening OM3. The second opening OM2 may have a polygonal shape, for example, such as a triangle, quadrangular shape, a rectangle, a pentagon, a hexagon, a heptagon, and an octagon. The number of second openings OM2 may be plural, and each of the plurality of second openings OM2 may be open to a part of one of the plurality of second electrodes E2. The second organic light emission layer OL2 emitting green light may be on the second electrode E2 open to the second opening OM2. Organic light emission layers emitting light of various colors, such as blue, red, and white, may be on the second electrode E2 open to the second opening OM2.

The third opening OM3 may be open to a part of the third electrode E3, and may have a substantially rectangular shape. The third opening OM3 may be spaced apart from the first opening OM1 and the second opening OM2, and may have a larger area than the first opening OM1 and the second opening OM2. The third opening OM3 may have a polygonal shape, for example, such as a triangle, quadrangular shape, a rectangle, a pentagon, a hexagon, a heptagon, and an octagon. The number of third openings OM3 may be plural, and each of the plurality of third openings OM3 may be open a part of one of the plurality of third electrodes E3. The third organic light emission layer OL3 emitting blue light may be on the third electrode E3 opened to the third opening OM3. Organic light emission layers emitting various colors, such as green, red, and white, and may be on the third electrode E3 open to the third opening OM3. The aforementioned first opening OM1, second opening OM2, and third opening OM3 may be spaced apart from each other, and a short side of each of the first opening OM1 and the second opening OM2 may face a long side of the third opening OM3.

The spacer SPC may be on a topmost portion of the pixel defining layer PDL. The spacer SPC may be at a crossing point of a first virtual line VL1 crossing a space between the first opening OM1 and the second opening OM2, and a second virtual line VL2 crossing a space between the first opening OM1 and the third opening OM3. The spacer SPC may be at a point at which the first opening OM1, the second opening OM2, and the third opening OM3 are adjacent to each other, not between the first opening OM1 and the second opening OM2. The number of spacers SPC may be plural, and each of the plurality of spacers SPC may be at a crossing point of one of the plurality of first virtual lines VL1 and one of the plurality of second virtual lines VL2. The spacer SPC may include a main body MB, a first protrusion PR1, a second protrusion PR2, and a third protrusion PR3.

The main body MB may be at a crossing point of the first virtual line VL1 and the second virtual line VL2. The main body MB may have a quadrangular shape. The main body MB may have a polygonal shape, for example, such as a triangle, quadrangular shape, a rectangle, a pentagon, a hexagon, a heptagon, and an octagon. One corner of the main body MB spaced apart from the third opening OM3 may be adjacent to a corner of the first opening OM1, and the other corner of the main body MB spaced apart from the third opening OM3 may be adjacent to a corner of the second opening OM2. The main body MB may be spaced apart from the first opening OM1, the second opening OM2, and the third opening OM3. For example, the main body MB may be spaced apart from the third opening OM3 by a spaced distance LE of about 7 μm to about 14 μm. For example, the main body MB may be spaced apart from the third opening OM3 by a spaced distance LE of about 13 μm from the third opening OM3.

The first protrusion PR1 may protrude from the main body MB toward a space between the first opening OM1 and the second opening OM2 along the first virtual line VL1, and may have a triangular shape. The second protrusion PR2 may protrude from the main body MB toward a space between the first opening OM1 and the third opening OM3 along the second virtual line VL2, and may have a triangular shape. The third protrusion PR3 may protrude from the main body MB toward a space between the second opening OM2 and the third opening OM3 along the second virtual line VL2, and may have a triangular shape.

One or more of the first protrusion PR1, the second protrusion PR2, and the third protrusion PR3 may have an area that is, for example, about 3% to about 6% of the entire area of any one of the first opening OM1 and the second opening OM2, or, for example, may have an area substantially that is about 4.5% of the entire area of any one of the first opening OM1 and the second opening OM2. A combined area of the two first protrusions PR1 facing along the first virtual line VL1 may have an area of, for example, about 6% to about 12% of the entire area of any one of the first opening OM1 and the second opening OM2, or, for example, may substantially have an area of about 9% of the entire area of any one of the first opening OM1 and the second opening OM2. Further, a combined area of the second protrusion PR2 and the third protrusion PR3 facing along the second virtual line VL2 may have an area, for example, of about 6% to about 12% of the entire area of any one of the first opening OM1 and the second opening OM2, or, for example, may substantially have an area of about 9% of the entire area of any one of the first opening OM1 and the second opening OM2. The spacer SPC may be integral with the pixel defining layer PDS, or may include a different material from that of the pixel defining layer PDL.

The first common layer CL1 may be on the first electrode E1, the second electrode E2, the third electrode E3, the pixel defining layer PDL, and the spacer SPC, and may include one or more layers selected from a hole injection layer, a hole transporting layer, an electron injection layer, and an electron transporting layer. The first organic light emission layer OL1 may be on the first common layer CL1 on the first electrode E1 to correspond to the first opening OM1. The first organic light emission layer OL1 may include an organic material emitting red light, and may emit red light. The first organic light emission layer OL1 may include an organic material emitting light of green, blue, or white, and, for example, the first organic light emission layer OL1 may emit green, blue, or white light.

The second organic light emission layer OL2 may be on the first common layer CL1 on the second electrode E2 to correspond to the second opening OM2. The second organic light emission layer OL2 may include an organic material emitting green light, and may emit green light. The second organic light emission layer OL2 may include an organic material emitting red, blue, or white light, and, for example, the second organic light emission layer OL2 may emit red, blue, or white light.

The third organic light emission layer OL3 may be on the first common layer CL1 on the third electrode E3 to correspond to the third opening OM3. The third organic light emission layer OL3 may include an organic material emitting blue light, and may emit blue light. The third organic light emission layer OL3 may include an organic material emitting red, green, or white light, and, for example, the third organic light emission layer OL3 may emit red, green, or white light. The aforementioned first organic light emission layer OL1, second organic light emission layer OL2, and third organic light emission layer OL3 may emit light of different colors, respectively. Further, the third organic light emission layer OL3 may emit blue light, and any one of the first organic light emission layer OL1 and the second organic light emission layer OL2 emits red light, and the other one may emit green light.

The second common layer LC2 may be on the first common layer CL1 on the first organic light emission layer OL1, the second organic light emission layer OL2, the third organic light emission layer OL3, the pixel defining layer PDL, and the spacer SPC, and may include one or more layers selected from a hole injection layer, a hole transporting layer, an electron injection layer, and an electron transporting layer. The common electrode CE may be on the second common layer CL2 over an entire surface or partial surface of the first substrate SU1, and may be a cathode serving as an electron injection electrode, or an anode serving as a hole injection electrode. The common electrode CE may include a light transmissive electrode or a light reflective electrode. The second substrate SU2 may include an insulating substrate including glass, quartz, ceramic, metal, plastics, or the like. Further, for example, when the second substrate SU2 is made of plastics or the like similar to the first substrate SU1, the OLED display may have a flexible characteristic, a stretchable characteristic, and/or rollable characteristic.

In the OLED display 1000, the spacer SPC may be at the crossing point of the first virtual line VL1 crossing the space between the first opening OM1 and the second opening OM2 and the second virtual line VL2 crossing the space between the first opening OM1 and the third opening OM3. If the second substrate SU2 is bent due to external force, the second substrate SH2 may come into contact with the spacer SPC, and the material of the second common layer CL2 on the spacer SPC may be unintentionally transferred to the second substrate SU2. The material transferred to the second substrate SU2 is not on the first opening OM1, the second opening OM2, and the third opening OM3 even when the external force is removed and the second substrate SU2 returns to a flat form. A spot may be suppressed from being generated in light emitted through the first opening OM1, the second opening OM2, and the third opening OM3 from the first organic light emission layer OL1, the second organic light emission layer OL2, and the third organic light emission layer OL3.

In the OLED display 1000, the spacer SPC may include the first protrusion PR1 extended from the main body MB along the first virtual line VL1, and the second protrusion PR2 and the third protrusion PR3 may extend from the main body MB along the second virtual line VL2. Therefore, even though the second substrate SU2 may be bent due to external force, the second substrate SU2 may be suppressed from being in contact with the first organic light emission layer OL1, the second organic light emission layer OL2, and the third organic light emission layer OL3 exposed by the first opening OM1, the second opening OM2, and the third opening OM3, respectively.

In the OLED display 1000, even though the spacer SPC may include the first protrusion PR1 and extending from the main body MB along the first virtual line VL1, and the second protrusion PR2 and the third protrusion PR3 extending from the main body MB along the second virtual line VL2, each of the first protrusion PR1, the second protrusion PR2, and the third protrusion PR3 may have a triangular shape, and the combined area of the two first protrusions PR1 facing each other along the first virtual line VL1 may have the area that may be, for example, about 6% to about 12% of the entire area of any one of the first opening OM1 and the second opening OM2. The combined area of the second protrusion PR2 and the third protrusion PR3 facing each other along the second virtual line VL2 may have an area, for example, of about 6% to about 12% of the entire area of any one of the first opening OM1 and the second opening OM2. For example, when the second substrate SU2 is bent due to external force and comes into contact with the first protrusion PR1, the second protrusion PR2, and the third protrusion PR3 such that the material of the second common layer CL2 on the spacer SPC is unintentionally transferred to the second substrate SU2, the material transferred to the second substrate SU2 may not be positioned on the first opening OM1, the second opening OM2, or the third opening OM3 even after the external force is removed and the second substrate returns to a flat form. A spot may be suppressed from being generated in light emitted through the first opening OM1, the second opening OM2, and the third opening OM3 from the first organic light emission layer OL1, the second organic light emission layer OL2, and the third organic light emission layer OL3. The OLED display 1000 may be provided in which a spot is suppressed from being generated in an image displayed by light emitted from each of the first organic light emission layer OL1, the second organic light emission layer OL2, and the third organic light emission layer OL3.

Figure 3:
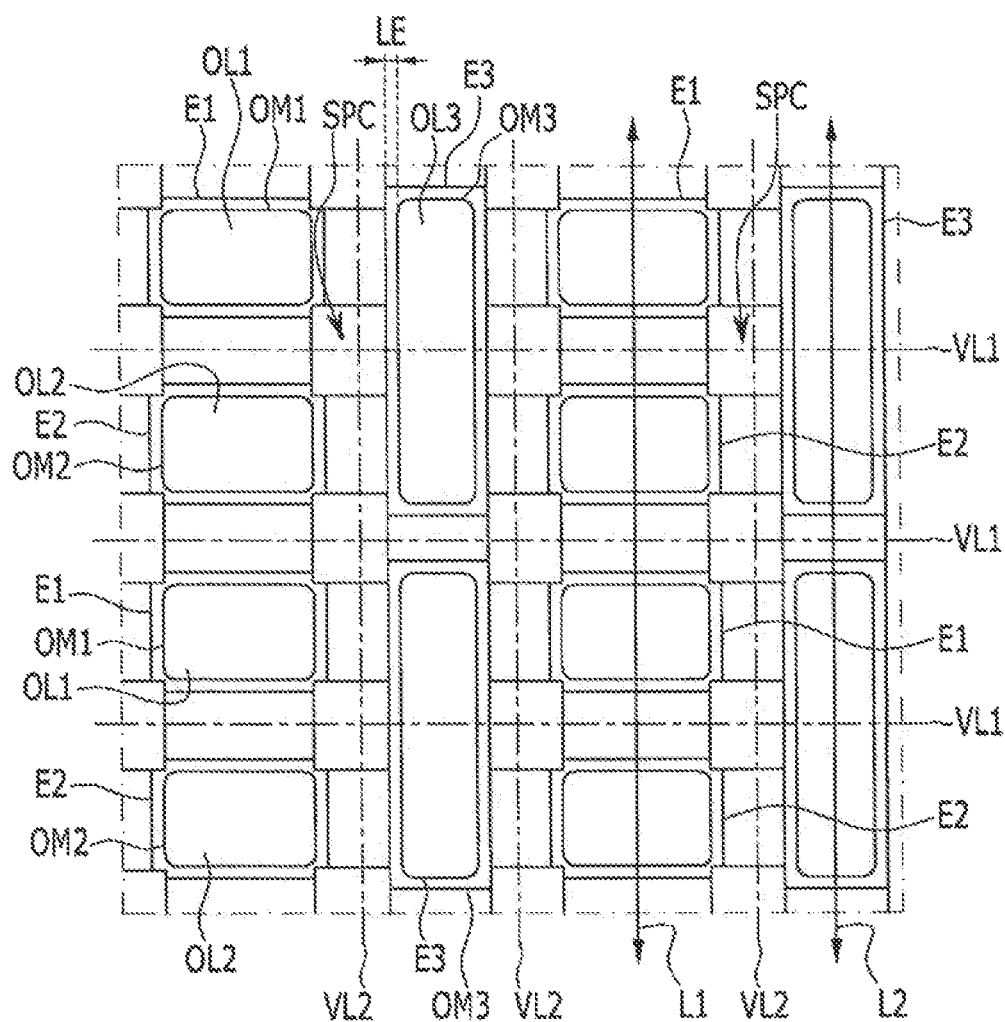
FIG. 3 illustrates a top plan view of a part of an OLED display according to another embodiment.

An OLED display according to another embodiment is described with reference to FIG. 3. FIG. 3 illustrates a top plan view of a part of the OLED display according to the embodiment. As illustrated in FIG. 3, a spacer SPC of an OLED display 1002 according to the second embodiment at a crossing point of a first virtual line VL1 and a second virtual line VL2, and may have a quadrangular shape. In the OLED display 1002 according to the second embodiment, the spacer SPC may be at a crossing point of the first virtual line VL1 crossing a space between a first opening OM1 and a second opening OM2 and the second virtual line VL2 crossing a space between the first opening OM1 and a third opening OM3, and may have a quadrangular shape. For example, when a second substrate SU2 is bent due to external force and comes into contact with the spacer SPC such that a material of a second common layer CL2 on the spacer SPC is unintentionally transferred to the second substrate SU2, the material transferred to the second substrate SU2 need not be positioned on the first opening OM1, the second opening OM2, or the third opening OM3 even when the external force is removed and the second substrate SU2 returns to a flat form. A spot may be suppressed from being generated in light emitted through the first opening OM1, the second opening OM2, and the third opening OM3 from a first organic light emission layer OL1, a second organic light emission layer OL2, and a third organic light emission layer OL3. The OLED display 1002 may be provided in which a spot may be suppressed from being generated in an image displayed by light emitted from the first organic light emission layer OL1, the second organic light emission layer OL2, and the third organic light emission layer OL3.

By way of summation and review, an OLED display may include a first substrate, a pixel circuit including a thin film transistor, a first electrode connected with the pixel circuit, a pixel defining layer including a plurality of openings through which the first electrode may be exposed, a spacer on the pixel defining layer, an organic light emission layer on the first electrode to correspond to the opening, a second electrode on the organic light emission layer, and a second substrate on the second electrode. The spacer may be between the adjacent openings, and when, for example, the second substrate may be bent due to external force, the second substrate may be in contact with the spacer, so that a material on the spacer may be unintentionally transferred to the second substrate. For example, when the second substrate returns to a flat form after removing the external force, the material transferred to the second substrate may be on the opening such that a spot may be generated in light emitted through the opening from the organic light emission layer.

As described herein, an OLED display is provided in which even though the second substrate may be bent due to external force so that a material on the spacer may is transferred to the second substrate, the material transferred to the second substrate may be suppressed from being on the opening.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light emitting diode display, comprising:
    a substrate;
    a first electrode on the substrate;
    a second electrode adjacent to the first electrode;
    a third electrode adjacent to the first electrode and second electrode;
    a pixel defining layer on the first electrode, the second electrode, and the third electrode, the pixel defining layer comprising:
        a first opening overlapping the first electrode;
        a second opening overlapping the second electrode; and
        a third opening overlapping the third electrode;
    a first organic light emission layer in the first openings;
    a second organic light emission layer in the second openings;
    a third organic light emission layer in the third openings; and
    a spacer on the pixel defining layer,
    wherein:
        a first virtual line crosses the first opening and crosses between the second opening and the third opening;
        a second virtual line crosses between the first opening and the third opening, and between the first opening and the second opening;
        the first virtual line and the second virtual line are perpendicular to each other;
        the spacer overlaps a crossing point of the first virtual line and the second virtual line; and
        each of the first organic light emission layer, the second organic light emission layer, and the third organic light emission layer emits light of a different color.

2. The organic light emitting diode display of claim 1, wherein the first organic light emission layer emits blue light, and any one of the second organic light emission layer and the third organic light emission layer emits red light, and the other one emits green light.

3. The organic light emitting diode display of claim 2, wherein the first opening has a first side parallel to the second virtual line in a plan view.

4. The organic light emitting diode display of claim 3, wherein the spacer has a second side parallel to the second virtual line in a plan view.

5. The organic light emitting diode display of claim 4, wherein a length of the second side of the spacer is the same as or shorter than the first side of the first opening.

6. The organic light emitting diode display of claim 5, wherein the length of the second side of the spacer is substantially same as a distance between the second opening and the third opening.

7. The organic light emitting diode display of claim 2, wherein the first opening has a third side parallel to the first virtual line in a plan view.

8. The organic light emitting diode display of claim 7, wherein the spacer has a fourth side parallel to the first virtual line in a plan view.

9. The organic light emitting diode display of claim 8, wherein a length of the fourth side of the spacer is substantially the same as a distance between the first electrode and the second opening.

10. The organic light emitting diode display of claim 8, wherein a length of the fourth side of the spacer is substantially the same as a distance between the first electrode and the third opening.

11. The organic light emitting diode display of claim 2, wherein the first opening has a rectangular shape having a first side and a second side in a plan view.

12. The organic light emitting diode display of claim 11, wherein the rectangular shape has a chamfered corner, on which the first side and the second side meet.

13. The organic light emitting diode display of claim 12, wherein the chamfered corner has a curved shape.

14. An organic light emitting diode display, comprising:
    a substrate;
    a first electrode on the substrate;
    a second electrode adjacent to the first electrode;
    a third electrode adjacent to the first electrode and second electrode;
    a pixel defining layer on the first electrode, the second electrode, and the third electrode, the pixel defining layer comprising:
        a first opening overlapping the first electrode;
        a second opening overlapping the second electrode; and
        a third opening overlapping the third electrode;
    a first organic light emission layer emitting blue light in the first openings;
    a second organic light emission layer emitting red light in the second openings;
    a third organic light emission layer emitting green light in the third openings; and
    a spacer on the pixel defining layer,
    wherein:
        a first virtual line crosses the first opening and crosses between the second opening and the third opening;
        a second virtual line crosses between the first opening and the third opening, and between the first opening and the second opening;
        the first virtual line and the second virtual line are perpendicular to each other; and
        the spacer overlaps a crossing point of the first virtual line and the second virtual line.

15. The organic light emitting diode display of claim 14, wherein the first opening has a first side parallel to the second virtual line in a plan view.

16. The organic light emitting diode display of claim 15, wherein the spacer has a second side parallel to the second virtual line in a plan view.

17. The organic light emitting diode display of claim 16, wherein a length of the second side of the spacer is the same as or shorter than the first side of the first opening.

18. The organic light emitting diode display of claim 17, wherein the length of the second side of the spacer is substantially same as a distance between the second opening and the third opening.

19. An organic light emitting diode display, comprising:
a substrate;
a first electrode on the substrate;
a second electrode adjacent to the first electrode;
a third electrode adjacent to the first electrode and second electrode;
a pixel defining layer on the first electrode, the second electrode, and the third electrode, the pixel defining layer comprising:
a first opening overlapping the first electrode;
a second opening overlapping the second electrode; and
a third opening overlapping the third electrode; and
a spacer on the pixel defining layer,
wherein:
a first virtual line crosses the first opening and crosses between the second opening and the third opening;
a second virtual line crosses between the first opening and the third opening, and between the first opening and the second opening;
the first virtual line and the second virtual line are perpendicular to each other;
the spacer overlaps a crossing point of the first virtual line and the second virtual line;
the first opening has a first side parallel to the second virtual line in a plan view; and
the spacer has a second side parallel to the second virtual line in a plan view.

20. The organic light emitting diode display of claim 19, further comprising:
a first organic light emission layer in the first openings;
a second organic light emission layer in the second openings; and
a third organic light emission layer in the third openings,
wherein each of the first organic light emission layer, the second organic light emission layer, and the third organic light emission layer emits light of a different color.

21. An organic light emitting diode display, comprising:
a substrate;
a first pixel electrode on the substrate;
a second pixel electrode adjacent to the first pixel electrode;
a third pixel electrode adjacent to the first pixel electrode and the second pixel electrode;
a pixel defining layer having a first opening on the first pixel electrode, a second opening on the second pixel electrode, and a third opening on the third pixel electrode,
a spacer poisoned at a crossing point of a first virtual line with a second virtual line on the pixel defining layer,
wherein:
a first side of the first opening and a first side of the second opening face each other and are parallel with each other;
a first side of the third opening faces a second side of the first opening;
the first virtual line crosses the third opening and an area between the first opening and the second opening and is parallel to the first side of the first opening; and
the second virtual line crosses an area between the third opening and the first opening and an area between the third opening and the second opening.

22. The organic light emitting diode display of claim 21, wherein the second virtual line is parallel to the first side of the third opening.

23. The organic light emitting diode display of claim 22, wherein the first virtual line and the second virtual line are perpendicular to each other.

24. The organic light emitting diode display of claim 23, wherein the spacer has a rectangular shape.

25. The organic light emitting diode display of claim 24, wherein a first side of the spacer is parallel to the first side of the first opening.

26. The organic light emitting diode display of claim 25, wherein the first opening has a rectangular shape.

27. The organic light emitting diode display of claim 26, wherein the rectangular shape has a chamfered corner.

28. The organic light emitting diode display of claim 27, wherein the second opening has a rectangular shape.

29. The organic light emitting diode display of claim 28, wherein the rectangular shape has a chamfered corner.

30. The organic light emitting diode display of claim 29, wherein the first side of the first opening and the first side of the second opening have a same length.

31. The organic light emitting diode display of claim 30, wherein an area of the third opening is larger than an area of the first opening.

32. The organic light emitting diode display of claim 31, the third opening emits a blue light.

33. The organic light emitting diode display of claim 23, wherein the first opening and the second opening have a same area.

34. The organic light emitting diode display of claim 33, wherein the first opening has a polygonal shape, including one of a triangle, quadrangular shape, a rectangle, a pentagon, a hexagon, a heptagon, and an octagon.

35. The organic light emitting diode display of claim 34, wherein the polygonal shape has a chamfered corner.

36. The organic light emitting diode display of claim 35, wherein the first side of the first opening and the first side of the second opening have a same length.

37. The organic light emitting diode display of claim 34, wherein the spacer has a polygonal shape, including one of a triangle, quadrangular shape, a rectangle, a pentagon, a hexagon, a heptagon, and an octagon.

38. The organic light emitting diode display of claim 37, wherein the spacer has a rectangular shape.

39. The organic light emitting diode display of claim 38, wherein a first side of the spacer is parallel to the first side of the first opening.

40. The organic light emitting diode display of claim 39, wherein the first side of the first opening and the first side of the second opening have a same length.

* * * * *